(12) United States Patent
Szolyga et al.

(10) Patent No.: US 9,148,614 B2
(45) Date of Patent: Sep. 29, 2015

(54) TOUCH-ENABLED VIDEO WALL SUPPORT SYSTEM, APPARATUS, AND METHOD

(75) Inventors: Thomas H. Szolyga, Saratoga, CA (US); David Vu Dao, Milpiltas, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 148 days.

(21) Appl. No.: 13/817,640

(22) PCT Filed: Oct. 25, 2010

(86) PCT No.: PCT/US2010/053964
§ 371 (c)(1),
(2), (4) Date: Feb. 19, 2013

(87) PCT Pub. No.: WO2012/057734
PCT Pub. Date: May 3, 2012

(65) Prior Publication Data
US 2013/0148324 A1    Jun. 13, 2013

(51) Int. Cl.
*H04N 5/64*    (2006.01)
*H05K 13/04*    (2006.01)
(Continued)

(52) U.S. Cl.
CPC .............. *H04N 5/64* (2013.01); *F16M 13/02* (2013.01); *G06F 3/041* (2013.01); *H05K 5/0017* (2013.01);
(Continued)

(58) Field of Classification Search
CPC ..... H05K 5/0017; H05K 5/0204; H05K 7/16; H05K 1/14; H05K 1/148; H05K 5/008; H05K 5/0021; H05K 5/02; H05K 5/0217; H05K 5/0226; H05K 5/03; H05K 7/00; H05K 7/18; H05K 9/0037; F16M 11/08; F16M 11/10; F16M 11/2021; F16M 11/2064; F16M 11/28; F16M 11/42; F16M 11/425; F16M 13/02; F16M 13/022; G06F 3/041; G06F 1/1681; G06F 1/16; G06F 1/1601; G06F 1/1605; G06F 1/1607; G06F 1/1637; G06F 2200/1633; G06F 2203/04104; G06F 3/01; G06F 3/0208; G06F 3/03545; G06F 3/0412; G06F 3/0421; G06F 3/048; G06F 3/0481

USPC .............. 361/809, 679.27, 752, 679.01, 807; 211/85.26, 87.01, 169, 119.003, 188, 211/169.1, 170–174, 184, 207; 248/158, 248/121, 123.11, 222.52, 226.11, 229.2, 248/371, 689; 312/223.1
See application file for complete search history.

(56) References Cited

U.S. PATENT DOCUMENTS 6,550,521 B1 * 4/2003 McNabb ....................... 160/135
8,164,581 B2 * 4/2012 Tsai et al. ..................... 345/175
(Continued)

FOREIGN PATENT DOCUMENTS

KR    10-093060043 B1    12/2009
WO    PCT-WO94/17637 A1    8/1994

OTHER PUBLICATIONS

Internation Search Report Date of Mailing Oct. 31, 2011. Application No. PCT/US2010/053964 Filing Date Oct. 25, 2010.

*Primary Examiner* — Hung S Bui
*Assistant Examiner* — Michael Matey
(74) *Attorney, Agent, or Firm* — Hewlett-Packard Patent Department (57) ABSTRACT

Systems, apparatuses, and methods for supporting a touch-enabled video wall are provided. In one embodiment, a video wall support system may include a first frame of support members (12) to support an array of monitors (16) and a second frame of monitors (18) to support a touch-enabling optical system (40, 42). The first frame of support members (12) may support the array of monitors (16) such that display screens of the monitors (18) are substantially aligned in a first plane. The second frame of support members (14) may support the touch-enabling optical system (40, 42) such that the touch-enabling optical system (40, 42) may detect a user touch location through a second plane formed by the second frame of support members (14). This second plane may be substantially parallel to the first plane. The second frame of support members (14) may be disposed a distance from the first frame of support members (12).

14 Claims, 7 Drawing Sheets

(51) Int. Cl.
  *H05K 5/00* (2006.01)
  *F16M 13/02* (2006.01)
  *G06F 3/041* (2006.01)
  *G06F 3/042* (2006.01)
  *H04N 21/414* (2011.01)
  *H04N 21/47* (2011.01)

(52) U.S. Cl.
  CPC .............. *H05K 13/04* (2013.01); *G06F 3/0425* (2013.01); *G09G 2300/026* (2013.01); *H04N 21/41415* (2013.01); *H04N 21/47* (2013.01); *Y10T 29/49899* (2013.01)

(56) References Cited

U.S. PATENT DOCUMENTS

| | | | |
|---|---|---|---|
| 2003/0133037 A1* | 7/2003 | Lee | 348/383 |
| 2003/0217495 A1* | 11/2003 | Nagamine et al. | 40/605 |
| 2005/0212982 A1 | 9/2005 | Soga | |
| 2006/0238669 A1* | 10/2006 | Chiang | 349/58 |
| 2009/0184221 A1* | 7/2009 | Sculler | 248/221.11 |
| 2009/0225506 A1 | 9/2009 | Lee et al. | 361/679.21 |
| 2011/0011997 A1* | 1/2011 | Cheng et al. | 248/221.12 |
| 2011/0032215 A1* | 2/2011 | Sirotich et al. | 345/175 |
| 2011/0032216 A1* | 2/2011 | Hos et al. | 345/175 |
| 2011/0101185 A1* | 5/2011 | Kitaguchi | 248/222.14 |
| 2011/0170253 A1* | 7/2011 | Liu et al. | 361/679.22 |
| 2011/0174939 A1* | 7/2011 | Taylor | 248/201 |
| 2011/0315837 A1* | 12/2011 | Mitsuhashi | 248/201 |
| 2012/0013529 A1* | 1/2012 | McGibney et al. | 345/156 |
| 2012/0032038 A1* | 2/2012 | Ye | 248/122.1 |
| 2012/0050137 A1* | 3/2012 | Hellenthal et al. | 345/1.3 |
| 2012/0249479 A1* | 10/2012 | Chtchetinine et al. | 345/175 |
| 2013/0135206 A1* | 5/2013 | Bolt et al. | 345/163 |
| 2013/0188327 A1* | 7/2013 | Lee et al. | 361/807 |
| 2014/0096404 A1* | 4/2014 | Chen | 33/301 |

* cited by examiner

TOUCH-ENABLED VIDEO WALL SUPPORT SYSTEM, APPARATUS, AND METHOD

BACKGROUND

Very large electronic displays, such as those large enough to cover a wall, may be formed from an array of monitors in an arrangement referred to as a "video wall." Some video walls may include, for example, 2×2 or 3×3 arrays of monitors that collectively display content across the array, creating the appearance of one single large monitor. Support scaffolding for typical video walls may generally hold the monitors in relatively loose alignment. While differences in monitor alignment could potentially be discernible to viewers, these differences may not impact the performance of the video wall.

A touch-enabled video wall, rather than simply passively displaying information, may allow users to interact with the information displayed on the video wall by touch. Certain touch-enabled video walls may determine when a user has touched a specific location of the video wall using an optical system. For example, such an optical system may use imaging devices and a reflective strip to determine when and where an object, such as a finger, crosses a plane directly in front of the monitors of the video wall. If the imaging devices and reflective strip become misaligned with the monitors of the video wall, perhaps by as little as 1-2 mm, the accuracy or precision of the touch interactivity of the touch-enabled video wall may drop dramatically.

Existing monitor array mounting solutions are generally used to mount monitor arrays for non-touch-enabled video wall applications. These existing monitor array mounting solutions may not attempt to keep the alignment of the monitors of the monitor array fully stable. That is, using the existing monitor array mounting solutions, when a monitor screen is touched, that monitor may move, albeit slightly, relative to other monitors of the video wall array. In addition, the weight of the monitor array may create a downward force in front of the supporting structure, creating a moment that causes the support structure to lean forward from a mount or even causing a wall upon which the monitor array is mounted to lean. Under such conditions, the monitor array and the optical system of a touch-enabled video wall may become misaligned. Since even slight misalignment between the various monitors of the monitor array and the optical system could impact the accuracy or precision of the touch-enabled video wall, the existing monitor array mounting solutions may not ensure the proper operation of a touch-enabled video wall.

DETAILED DESCRIPTION OF SPECIFIC EMBODIMENTS

As mentioned above, a touch-enabled video wall may include an array of video monitors and a touch-enabling optical system. The "touch-enabling optical system" may use imaging devices and a reflective strip to determine when and where an object, such as a finger, crosses a plane directly in front of the monitors of the video wall. Proper calibration of the optical system may depend heavily on the alignment of the optical system relative to the array of monitors. Thus, the present disclosure relates to various support structures that may provide rigid support to an array of monitors while maintaining alignment between these monitors and a touch-enabling optical system.

As will be described below, a support system for a touch-enabled video wall may include a first frame of support members (a "video frame") that rigidly holds the monitor array in a single plane, and a second frame of support members (a "touch frame") that holds the optical system parallel to the monitor array to enable touch interactivity with the video wall. The touch-enabled video wall support system may include a series of ladder structures. The "rungs" of the ladder structures may interface with a series of monitor support brackets that each attach to a monitor. For example, horizontal faces of horizontal members of the monitor support brackets may rest upon the horizontal members of the ladder structures. The horizontal faces of the horizontal members of the monitor support brackets may be angled to fit more easily between the vertical members of the ladder structures. These horizontal faces also may have a greater depth than that of the horizontal members of the ladder structures, allowing the horizontal faces to "catch" on the horizontal members of the ladder structures before installation of the monitor support brackets onto the ladder structures is complete. Additionally, monitor rods may vertically align a column of monitors, and a connecting bar joined to the monitor rods may provide horizontal alignment between rows of monitors.

Figure 1:
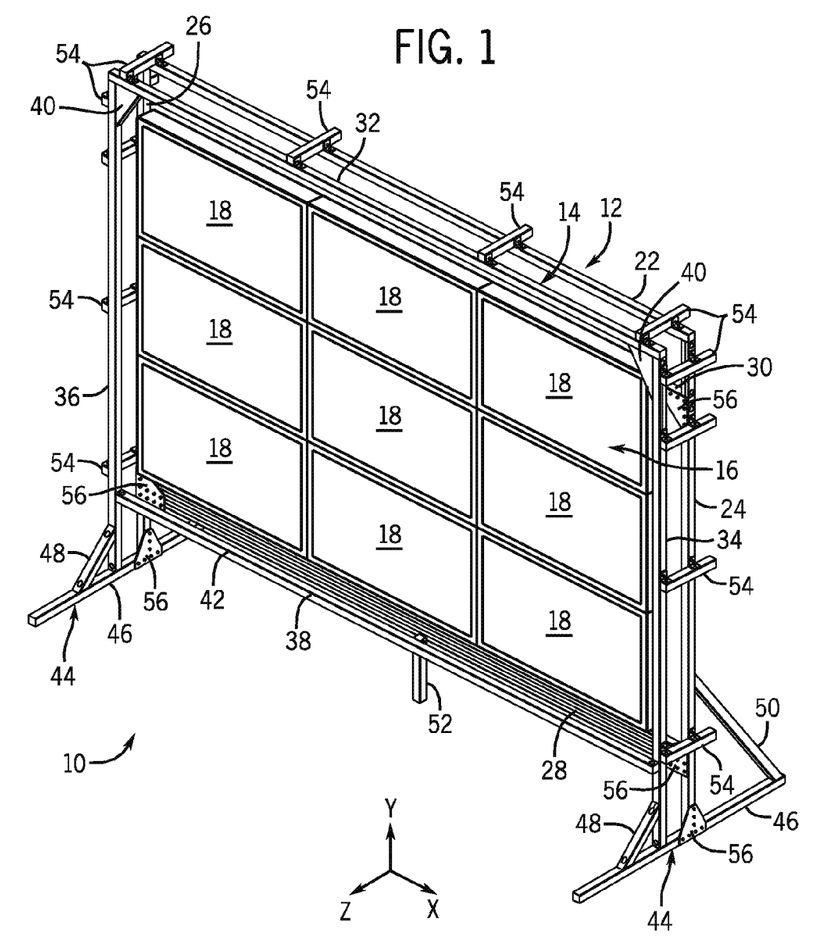
FIG. 1 is a perspective view of a touch-enabled video wall supported by a video wall support system, in accordance with an embodiment.

With the foregoing in mind, FIG. 1 illustrates a video wall support system 10 to support a touch-enabled video wall. By way of example, the touch-enabled video wall may be a Vantage Point™ Video Wall by Hewlett-Packard Company. The video wall support system 10 may include a video frame 12 and a touch frame 14 of support members. The support members of the video wall support system 10 may be formed from any suitable rigid support members, and may be, for example, steel or aluminum, and may or may not be extruded. These support members may connect to one another using any suitable attachment mechanism, including screws, bolts, welds, and so forth.

The video frame 12 may support a monitor array 16 that includes several monitors 18 arrayed to give the appearance of a single large display screen. In the example specifically shown in FIG. 1, the monitor array 16 includes an equal number of columns and rows of monitors, giving the effect of a single large monitor of the same portion as each individual monitor 18. By way of example, the monitors 18 may be relatively large plasma or liquid crystal display (LCD) monitors, such as 40 in., 42 in., or 46 in. LCD monitors available from various suppliers. A monitor support structure 20 of the video frame 12 both may support the monitor array 16 and ensure that all of the monitors 18 of the monitor array 16 generally remain in the same plane. Thus, as will be described below, when a user touches one of the monitors 18, that monitor 18 will not move out of alignment with the other monitors 18 of the monitor array 16.

The video frame 12 may be formed from an upper horizontal framing member 22, two outer vertical framing members 24 and 26, and a lower horizontal framing member 28. Each of the upper horizontal framing member 22 and outer vertical framing members 24 and 26 may have approximately the same width and depth (e.g., 1.5 in. by 1.5 in.). The lower horizontal framing member 28 of the video frame 12 may have a somewhat greater height, as depicted in FIG. 1, to provide additional support for the weight of the monitor array 16. The monitor support structure 20 may be framed by an upper monitor support member 30, the outer vertical framing members 24 and 26, and the lower horizontal framing member 28.

The touch frame 14 may include an upper horizontal framing member 32, outer vertical framing members 34 and 36, and a lower horizontal framing member 38. Two imaging devices 40 may be located in the upper corners of the touch frame 14 where the upper horizontal framing member 32 joins the outer vertical framing members 34 and 36. These imaging devices 40 may be aimed toward a reflective strip 42 that lines the interior of the lower horizontal framing member 38 and at least part of the interior of the outer vertical framing members 34 and 36. When a user touches a location on the monitor array 16, the imaging devices 40 may determine a change in the amount of light detected from the reflective strip 42, which may be used to pinpoint the location on the monitor array 16 touched by the user.

In some embodiments, the video frame 12 and the touch frame 14 may be supported by frame supports 44 that include certain foot members 46 and support members 48 and 50. Additionally, a support member 52 may offer additional support to the lower horizontal framing member 28 of the video frame 12. It should be noted that, in other embodiments, the video frame 12 may be attached directly to a wall.

The touch frame 14 may be rigidly coupled to the video frame 12 via a series of spacing bars 54. The spacing bars 54 may hold the touch frame 14 a particular distance from the video frame 12. Specifically, because placement of the imaging devices 40 and the reflective strip 42 too close to or too far from the monitor array 16 could cause the imaging devices 40 to wrongly register a user touch as occurring in a particular location of the monitor array 16. In some implementations, misalignment of the imaging devices 40 and the reflective strip 42 relative to the face of the monitor array 16 by even as little as 2 mm could result in improper touch screen operation. Thus, the spacing bars 54 all may rigidly hold the touch frame 14 apart from the video frame 12 such that the touch frame 14 is substantially parallel to the video frame 12. In some embodiments, the touch frame 14 may be parallel to the video frame 12 within a tolerance of 1 mm.

The spacing bars 54 are illustrated in FIG. 1 as attaching to some of the outer edges of the support members of the video frame 12 and the touch frame 14. The spacing bars 54 may be attached at any of a variety of possible separation distances, which may vary the spacing between the touch frame 14 and the video frame 12 as suitable for the current monitors 18 used in the monitor array 16. For example, if the monitors 18 of the monitor array 16 are upgraded or otherwise changed, and the distance between the face of the monitor array 16 to the plane of the touch frame 14 changes as a result, the spacing bars 54 may be reattached in a new spacing configuration such that the touch frame 14 moves closer to or further from the video frame 12. In other embodiments, the spacing bars 54 may be sized for a specific monitor array 16 of monitors 18 and disposed between opposite facing interior sides of the video frame 12 and the touch frame 14. While such an embodiment would not easily allow for future modifications, such an embodiment could cause the video wall support system 10 to take up slightly less space and/or may provide a somewhat more appealing aesthetic.

As mentioned above, the various members of the video wall support system 10 may be rigidly attached to one another. Thus, the video wall support structure 10 may include a variety of rigid angle braces 56 at various locations, as well as other braces to facilitate the rigidity of the video wall support system 10. In general, the video frame 12 and the touch frame 14 may be sufficiently rigidly attached to one another such that the touch frame 14 forms a plane that is substantially parallel to a plane of the screens of the monitors 18 of the monitor array 16. Indeed, in some embodiments, the plane of the touch frame 14 may be parallel to the plane of the screens of the monitor array 16 within a tolerance of 2 mm or less (e.g., 1 mm).

Figure 2:
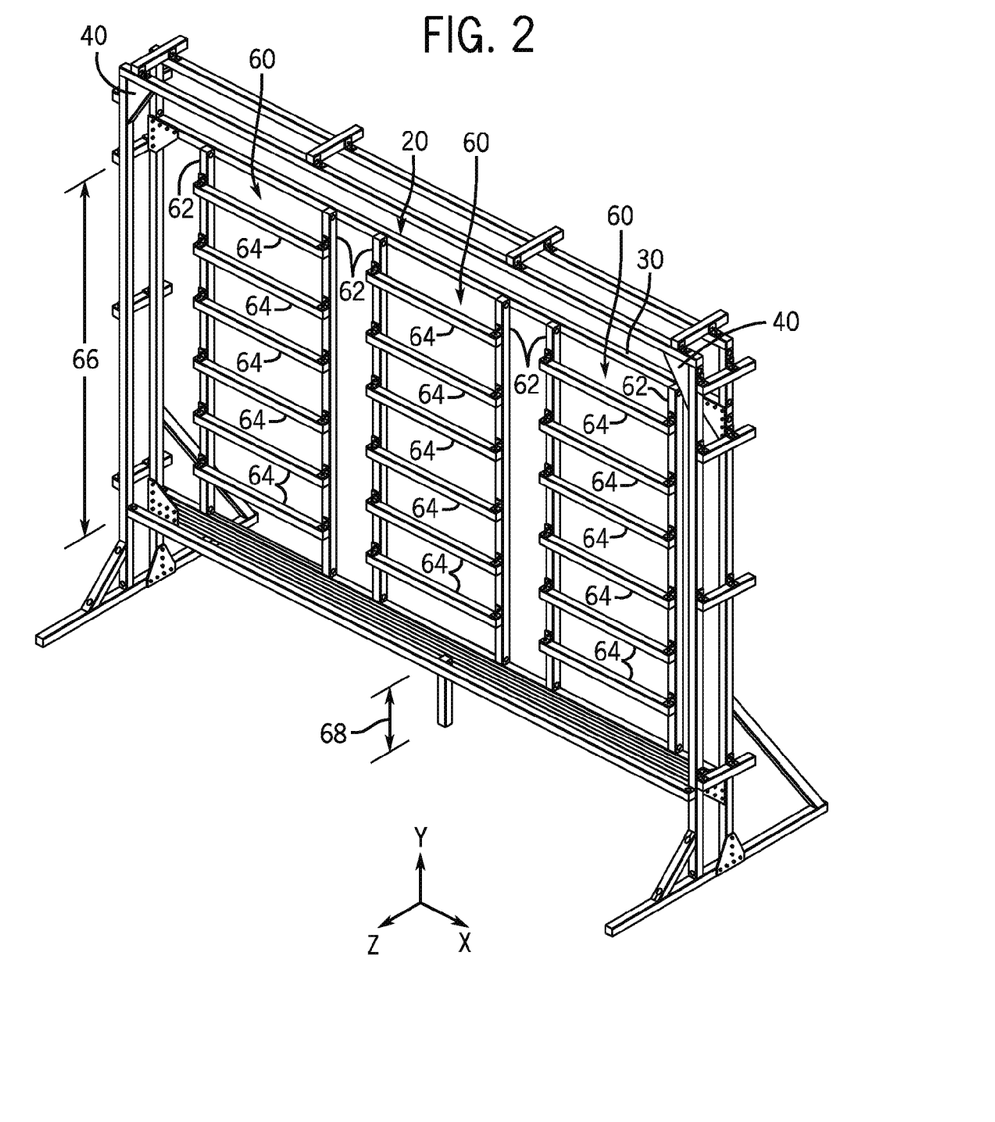
FIG. 2 is a perspective view of the video wall support system, in accordance with an embodiment.

FIG. 2 illustrates a view of the video wall support system 10 with the monitor array 16 removed. Specifically, in FIG. 2, it may be seen that the monitor support structure 20 includes several ladder structures 60. Each of these ladder structures 60 may include two vertical members 62 and several pairs of horizontal support members 64. In particular, the number of ladder structures 60 may correspond to the number of columns of monitors 18 that will appear in the monitor array 16. For example, if the monitor array 16 includes three columns, the monitor support structure 20 will include three ladder structures 60. Likewise, each of the ladder structures 60 may include a pair of the horizontal support members 64 for each row of monitors 18 in the monitor array 16. Thus, when the monitor array 16 includes three rows of monitors 18, each of the ladder structures 60 may include three pairs of horizontal support members 64. Indeed, some embodiments of the monitor support structure 20 may include more or fewer ladder structures 60 having more or fewer pairs of horizontal support members 64. In one embodiment, the monitor support structure 20 may support a 2×2 monitor array 16 having a 2×2 matrix of 60 in. monitors 18. Thus, the monitor support structure 20 may include two ladder structures 60, each of which may include two pairs of horizontal support members 64.

The ladder structures 60 may accommodate monitors 18 of a variety of sizes. In particular, to accommodate monitors 18 of various widths, the ladder structures 60 may be moved and attached at various horizontal positions along the upper monitor support member 30 and the lower horizontal framing member 28. Similarly, the pairs of horizontal support members 64 appearing in the ladder structure 60 may be moved and attached at various vertical positions so as to accommodate monitors 18 of various heights. The pairs of horizontal support members 64 may be attached higher or lower along the vertical members 62 of the ladder structures 60 depending on the size of the monitors 18 used in the monitor array 16.

A monitor frame height 66, representing a height of the monitor support structure in the video frame 12, may be any suitable size to accommodate the monitor array 16. For example, in one embodiment, the monitor frame height 66 may be approximately 65 in. Additionally, a base height 68 may be approximately 12 in., such that the monitor array 16, when attached to the monitor support structure 20 is high enough off of the floor such that a user may be able to touch across the monitor array 16. In general, the monitor frame height 66 and the base height 68 may be selected with human ergonomic concerns in mind. Specifically, the monitor frame height 66 and the base height 68 may be selected to be comfortable for an average person to touch various locations on the monitor array 16 by reaching or bending.

Figure 3:
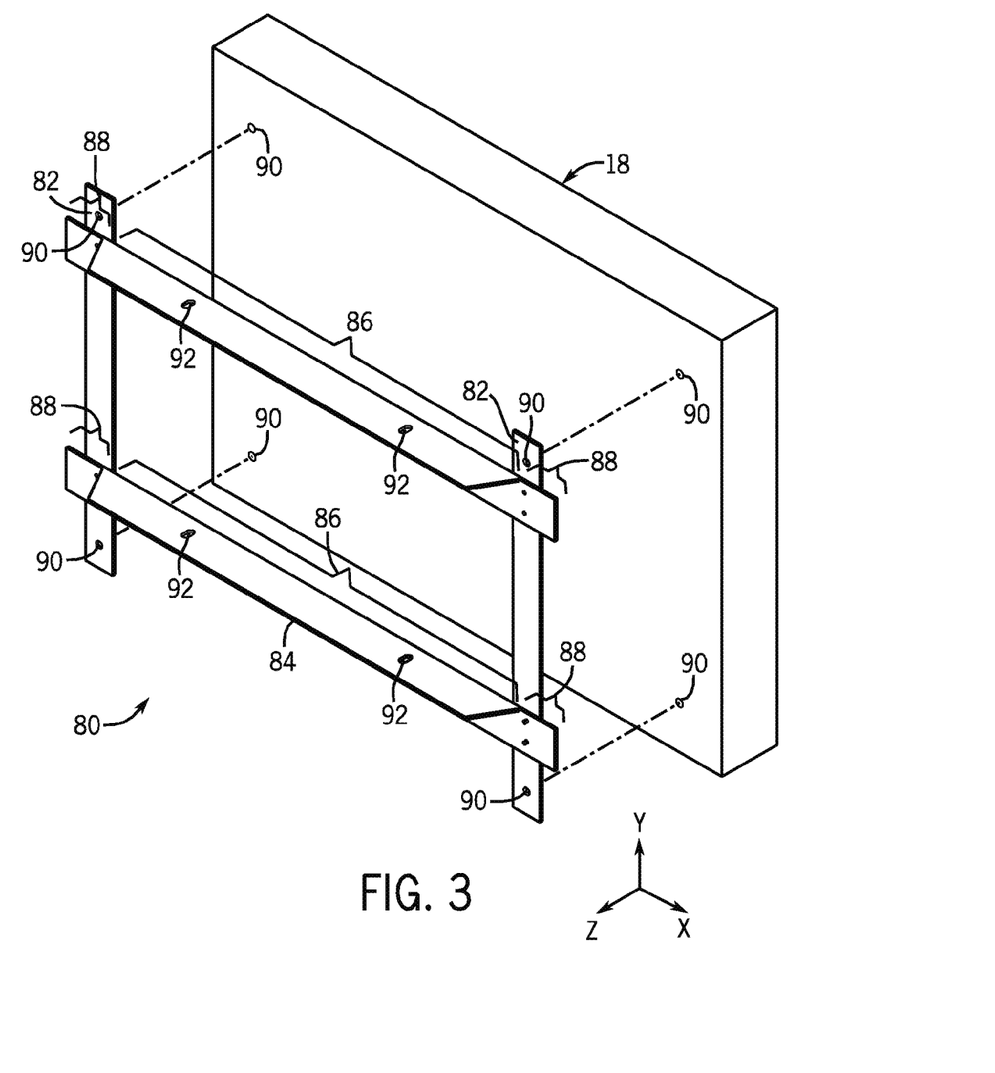
FIG. 3 is a perspective view of a monitor support bracket, in accordance with an embodiment.

A monitor support bracket 80, shown in FIG. 3, may couple a monitor 18 to a pair of the horizontal support members 64 of one of the ladder structures 60. The monitor support bracket 80 may include two vertical members 82 and two horizontal members 84. Each of the horizontal members 84 may include at least one horizontal face 84A on a horizontal plane and at least one vertical face 84B on a vertical plane. A center portion 86 of each of the horizontal members 84 may extend horizontally in the x-direction on both the horizontal face 84A and vertical face 84B, while outer portions 88 may extend horizontally in the x-direction only on the vertical face 84B. Thus, when the monitor support bracket 80 is attached to a monitor 18 via monitor attachment holes 90, substantially only the center portion 86 of the horizontal members may extend in the z-direction from the monitor 18. This center portion 86 may enable alignment and support for the monitor 18 within the ladder structure 60. Ladder structure attachment holes 92 may allow the monitor support bracket 80 to be attached to the horizontal support members 64 of a ladder structure 60.

Figure 4:
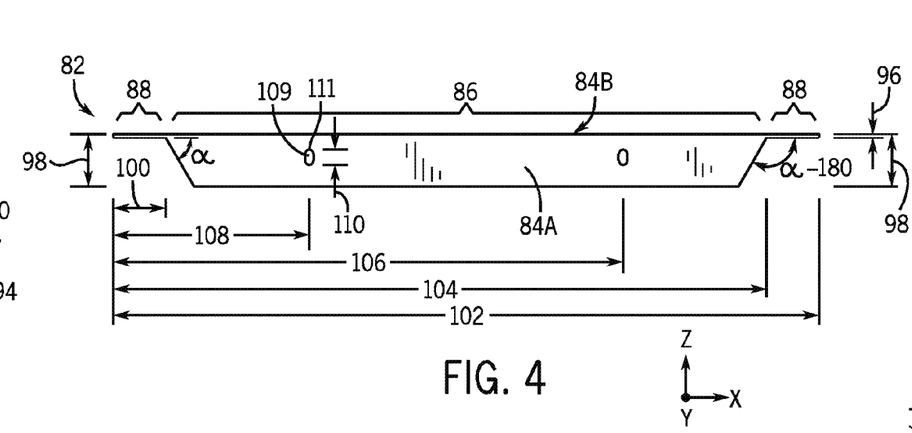
FIGS. 4 and 5 are top and side views, respectively, of a horizontal member of the monitor support bracket of FIG. 3, in accordance with an embodiment.
Figure 5:
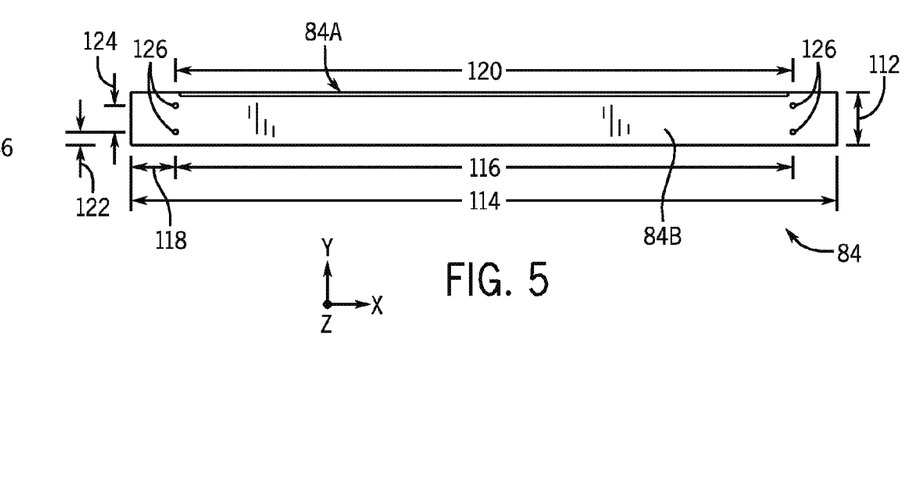
Figure 6:
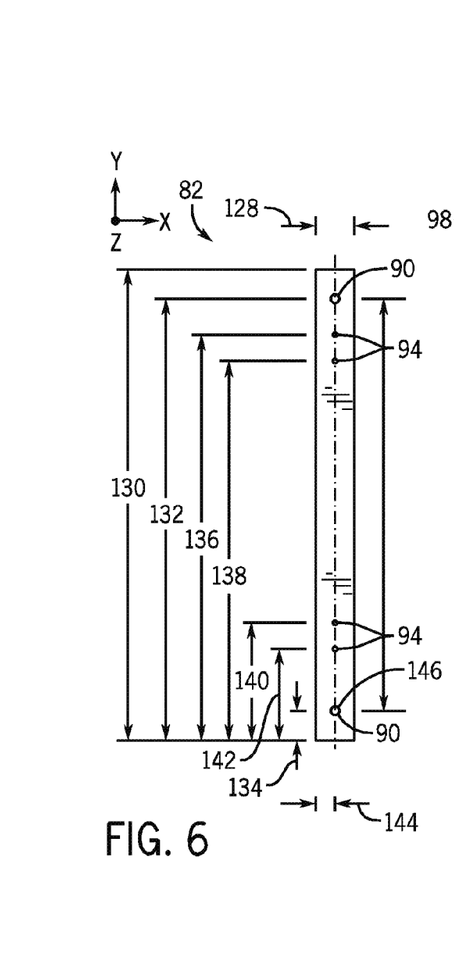
FIG. 6 is a side view of a vertical member of the monitor support bracket of FIG. 3, in accordance with an embodiment.

The components of the monitor support bracket 80 appear in FIGS. 4-6. In particular, FIG. 4 presents a top view of one of the horizontal members 84, FIG. 5 presents a side view of one of the horizontal members 84, and FIG. 6 presents a side view of one of the vertical members 82. The two horizontal members 84 of the monitor support bracket 80 generally may be identical, as may be the two vertical members 82. It should be appreciated that in general form of the horizontal member 84 represented in FIG. 4 may vary in other embodiments. The horizontal members 84 may be formed, for example, from ⅛ in. by 2 in. by 2 in. aluminum right-angle, square corner stock, and the vertical members 82 may be formed, for example, from ¼ in. 1.5 in. aluminum bar stock.

As noted above, the horizontal member 84 may include a center portion 86 and outer portions 88. In the top view of the horizontal member 84 shown in FIG. 4, the vertical face 84B of the horizontal member 84, which may extend across the center portion 86 and both outer portions 88, may have a thickness 96 that is relatively thin compared to a depth 98 of the horizontal face 84A of the horizontal member 84 in the y-direction. For example, in some embodiments, the thickness 96 may be approximately 0.125 in. and the depth 98 may be approximately 2.000 in. It should be appreciated that the depth 98 may be selected to be some amount greater than a depth of the horizontal support members 64 of the ladder structures 60. For example, when the horizontal support members 64 have a depth of approximately 1.500 in., the depth 98 may be approximately 0.500 in. greater. In other embodiments, the depth 98 may be approximately equal to or even less than the depth of the horizontal support members 64. As noted below, the difference between the depth 98 of the horizontal member 84 of the monitor support bracket 80 and the depth of the horizontal support members 64 of the ladder structures 60 may allow, during installation, a part of the monitor support bracket 80 to "catch" onto the horizontal support members 64 before a monitor 18 has been fully placed into the monitor array 16.

The outer portions 88 of the horizontal support members 84 may be substantially flush with the vertical members 62 of the ladder structure 60. In general, these outer portions 88 may have a length 100 approximately equal to or greater than that of the vertical members 62. Thus, when the vertical members 62 are 1.500 in. by 1.500 in., the length 100 may be approximately 1.500 in. or, as shown in FIG. 4, approximately 2.000. The outer portion 88 may fit to the face of the vertical members 62 because the center portion 86 may fit between the vertical members 62 over the horizontal support members 64 of the ladder structure 60. To facilitate the placement of the horizontal member 84 into the space forward between the vertical members 62 over the horizontal members 64, in angle α distinguishing the outer portions 88 and the center portion 86 may be approximately 90° degrees or less. In some embodiments, the angle α is 90° to provide additional rigidity between the components of the ladder structures 60 and the monitor support bracket 80. In other embodiments, such as the example illustrated in FIG. 4, the angle α may be less than approximately 90° but greater than approximately 30°, including approximately 60°.

The center portion 86 of the horizontal member 84 of the monitor support bracket 80 may have a length approximately equal to that of the distance between the vertical members 62 of one of the ladder structures 60. For example, when the vertical members 62 of the ladder structure 60 are separated by 23.000 in., the length of the center portion 86 may be approximately 23.000 in. Thus, a complete length 102 of the horizontal member 84 may be approximately 27.000 in., and a length 104 that excludes one of the outer portions 88 may be approximately 25.000 in.

A first of the ladder structure attachment holes 92 may be spaced a distance 106 approximately 19.500 in. from one end of the horizontal member 84 and a second of the ladder structure attachment holes 92 may be spaced a distance 108 approximately 7.500 in. from the same end of the horizontal member 84. A first radius of the ladder structure attachment holes 92 may be located at a depth 109 approximately half of the depth of the horizontal support members 64. Thus, when the depth of the horizontal support members 64 of the ladder structure 60 is approximately 1.500 in., the depth 106 will be approximately 0.750 in. The ladder structure attachment holes 92 may extend a length 110 of approximately 0.582 in. and may have outer radii 111 of approximately 0.166 in.

A side view of the horizontal member 84 of the monitor support bracket 80 appears in FIG. 5. As can be seen in FIG. 5, the horizontal face 84A may have a thickness approximately equal to the thickness 96 of the vertical face 84B. The vertical face 84B of the horizontal member 84 may have a height 112, which may be approximately equal to the depth 98 of the horizontal face 84A of the horizontal member 84. In some embodiments, the height 112 may be approximately 2.000 in. In other embodiments, the height 112 may vary. The overall length 114 of the horizontal member 84 includes the center portion 86 as well as the outer portions 88, and generally may be equivalent to the width from the distance between the outer edges of the vertical member 62 of the ladder structures 60. Thus, in some embodiments, when the vertical members 62 are separated from each other by 23.000 in., and the vertical members 62 themselves have a width of approximately 1.500 in., the length 114 may be approximately 27.000 in. A length 116 may represent a length from an edge of the horizontal member 84 to a center of a first pair of the monitor support bracket attachment holes 94. In some embodiments, the length 116 may be approximately 25.311 in. A length 118 may represent a length from the same edge of the horizontal member 84 to a center of a second pair of the monitor support bracket attachment holes 94. In some embodiments, the length 118 may be approximately 1.689 in.

Thus, a length 120 between the two pairs of monitor support bracket attachment holes 94 may be approximately 23.622 in. Likewise, in some embodiments, a length 122 may be approximately 0.500 in. and a length 124 may be approximately 1.000 in. The monitor support bracket attachment holes 94 may have a diameter 126 of approximately 0.177 in. and may be countersunk.

The vertical member 82 of the monitor support bracket 80 appears in FIG. 6. As shown in FIG. 6, the vertical member 82 may have a width 128 of any suitable amount, including 1.500 in. in some embodiments. A height 130 of the vertical member 82 of the monitor support bracket 80 may be, in some embodiments approximately 18.000 in., but may vary depending upon the size of the monitors 18 that will form the monitor array 16 of the video wall. A distance 132 between the base of the vertical member 82 and the center of an upper of the monitor attachment holes 90 may be approximately 16.874 in., while a distance 134 between the base of the vertical member 82 and the center of a lower of the monitor attachment holes 90 may be approximately 1.126 in. An upper pair of the monitor support bracket attachment holes 94 may be distances 136 and 138 from the base of the vertical member 82 of approximately 15.500 in. and 14.500 in., respectively. A lower pair of the monitor support bracket attachment holes 94 may be distances 140 and 142 from the base of the vertical member 82 of approximately. 4.500 in. and 3.500 in., respectively. The monitor support bracket attachment holes 94 and the monitor attachment holes 90 may be located approximately midway in the x-direction of the vertical member 82, or approximately a length 144 of approximately 0.750 in. when the width 128 is 1.500 in. The monitor attachment holes 90 may have a diameter 146 of approximately 0.339 in. and may be spaced apart by approximately 15.748 in.

Figure 7:
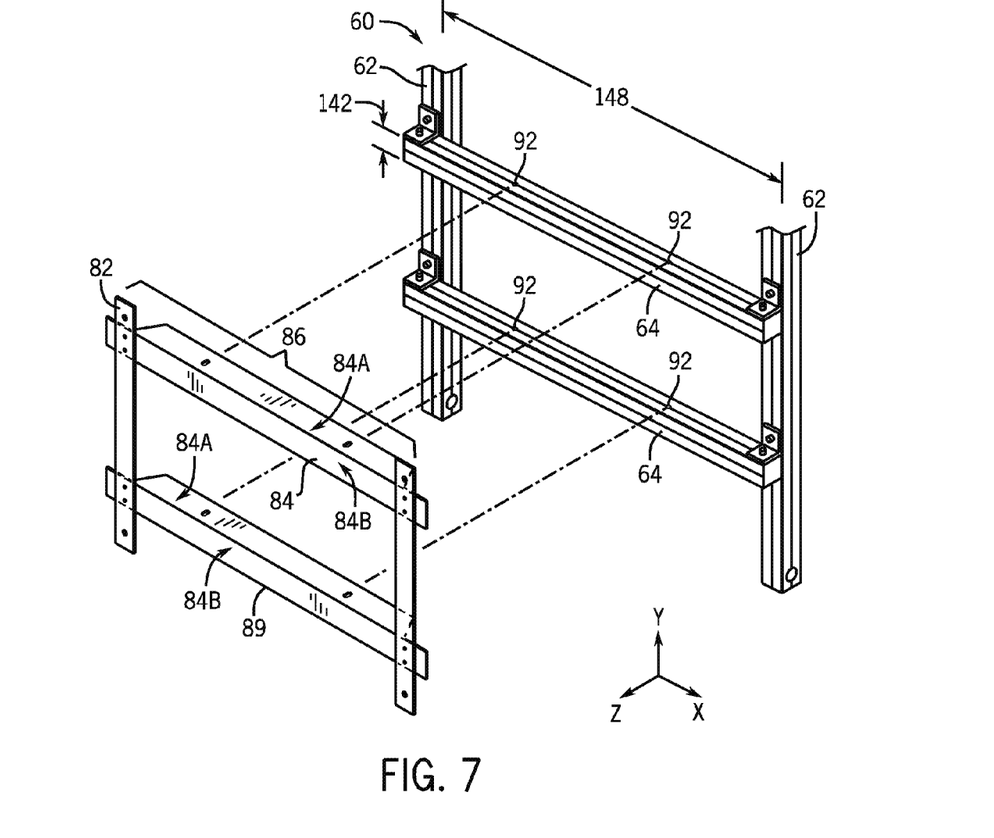
FIG. 7 is a perspective view illustrating the interposing of the monitor mounting bracket of FIG. 3 and the video wall support system of FIG. 2, in accordance with an embodiment.

The monitor support bracket 80 may fit to a pair of horizontal support members 64 of a ladder structure 60, as shown in FIG. 7. That is, after a monitor 18 has been affixed to the monitor support bracket 80, the monitor support bracket 80 may be placed onto a pair of horizontal support members 64 in the ladder structure 60. It should be noted that the center portion 86 of the horizontal members 84 of the monitor support bracket 80 will fit within a distance 148 between the two vertical support members 62 of the ladder structure 60. In some embodiments, the center portion 86 may be substantially the same as the distance 148, which may be, for example, approximately 23.000 in. As noted above, the depth 98 of the horizontal face 84A of the horizontal member 84 may be greater than a depth 142 of the horizontal support members 64 of the ladder structures 60. For example, when the depth 142 is approximately 1.500 in., the depth 98 may be approximately 2.000 in. Thus, even if the monitor 18 that is attached to the monitor support bracket 80 is being placed onto a pair of horizontal support members 64 in a section of the monitor array that is surrounded by other monitors 18, the outer edge of the horizontal face 84A of the horizontal member 84 will begin to rest on the horizontal support member 64 of the ladder structure 60 before the monitor 18 is fully aligned with all of the other monitors 18 in the monitor array 16, allowing for easier installation.

Figure 8:
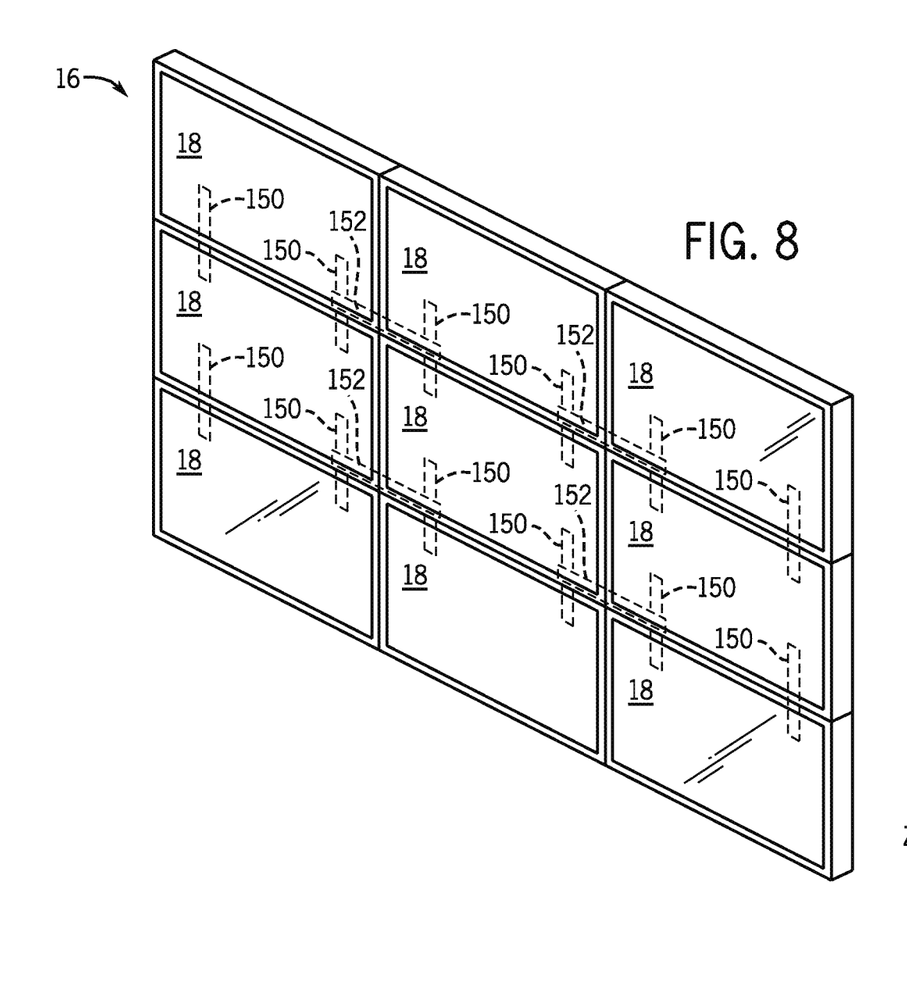
FIG. 8 is a perspective view of additional monitor array support, including a horizontal monitor connection bar, in accordance with an embodiment.

After the monitor array 16 has been affixed to the video wall support system 10, certain additional structures may provide further vertical and horizontal rigidity and interconnectedness. Namely, as shown in FIG. 8, vertical monitor rods 150 may fit within the monitors 18 of the monitor array 16 to provide vertical alignment and additional rigidity and support. These vertical monitor rods 150 may be provided by the manufacturer of the monitors 18. For example, certain monitors 18 manufactured by Samsung may be outfitted with internal structures to hold the vertical monitor rods 150, which may join monitors 18 located directly above or below one another.

While the vertical monitor rods 150 may provide vertical alignment and rigidity, the vertical monitor rods 150 alone may not provide horizontal alignment and rigidity. Thus, the monitor array 16 also may include horizontal monitor connection bars 152 that may attach to certain of the vertical monitor rods 150. For example, in some embodiments, a horizontal monitor connection bar 152 may attach from a vertical monitor rod 150 that connects two monitors 18 aligned vertically to an adjacent vertical monitor rod 150 that connects another two monitors 18 in vertical alignment. When the horizontal monitor connection bar 52 is attached, horizontal alignment between the two monitors 18 attached by the first vertical monitor rod 150 and the two monitors 18 attached to the second vertical monitor rod 150 collectively may become aligned.

Figure 9:
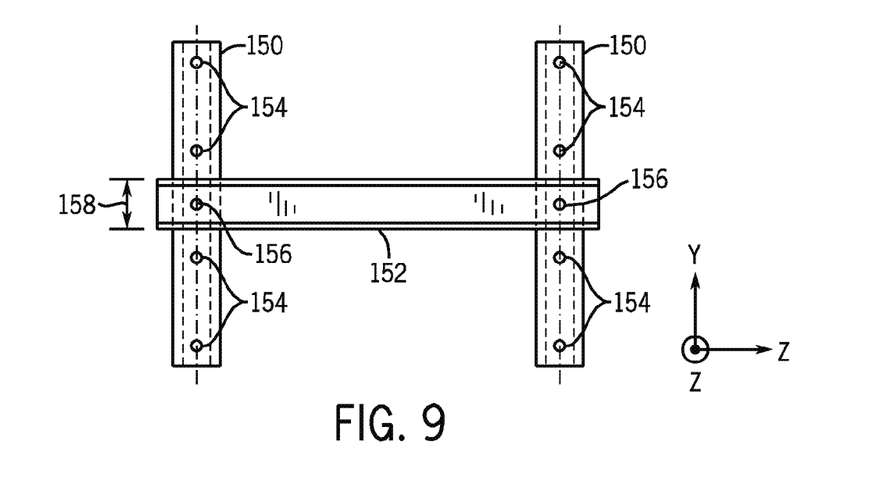
FIG. 9 is a side view of the horizontal monitor connection bar coupled to two vertical monitor rods, in accordance with an embodiment.

Two vertical monitor rods 150 joined by a horizontal monitor connection bar 152 appear in FIG. 9. Each of the vertical monitor rods 150 may include a number of monitor attachment holes 154 to attach to a monitor 18. Additionally, the vertical monitor rods 150 may include a horizontal monitor connection bar attachment hole 156 to connect to the horizontal monitor connection bar 152. The horizontal monitor connection bar 152 may be any suitable size, including, in some embodiments, approximately the same width and thickness as the vertical monitor rods 150. For example, the horizontal monitor connection bar 152 may have a height 158 of approximately 1.000 in., and may extend beyond the vertical monitor rods 150 slightly. Specifically, in some embodiments, from the center of the horizontal monitor connection bar attachment hole 156 to the outer edge of the horizontal monitor connection bar 152 may be a distance 160 of approximately 0.7500 in. It should be appreciated that, in some embodiments, the horizontal monitor connection bar attachment holes 156 may attach the vertical monitor rods 150 to the horizontal monitor connection bar 152 via a 10-32 1 in. round head screw. In some embodiments, the horizontal monitor connection bar 152 may be a ⅛ in. by 1 in. by ½ in. aluminum 6061 alloy, channel stock.

Figure 10:
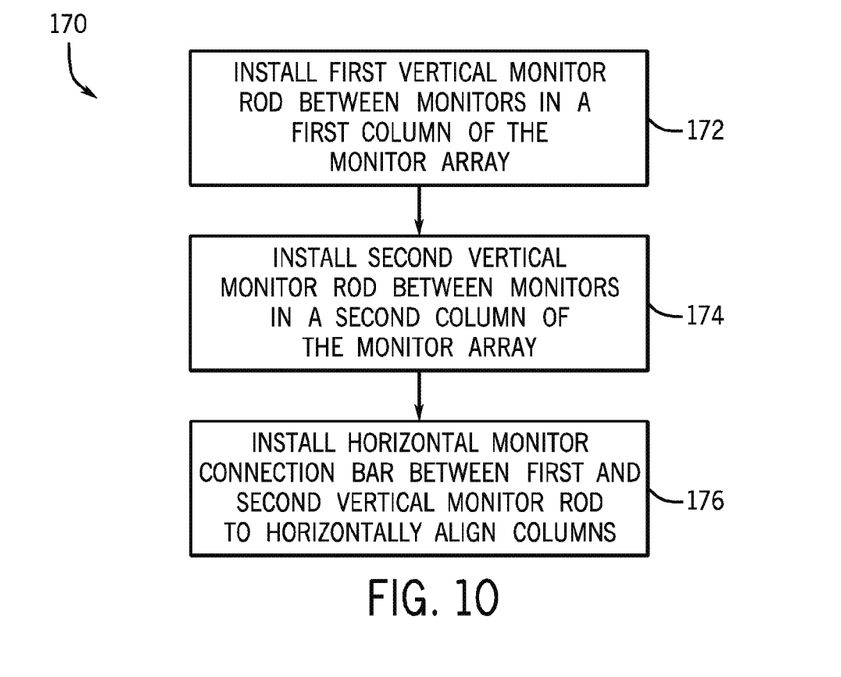
FIG. 10 is a flowchart describing an embodiment of a method for installing the additional monitor array support of FIG. 8.

Installation of the monitor array 16 may involve installing the vertical monitor rods 150, joining two vertical monitor rods 150 using a horizontal monitor connection bar 152 where four adjacent monitors 18 appear. FIG. 10 presents a flowchart 170 illustrating such a method. The flowchart 170 may begin when a first vertical monitor rod 150 is installed between a first pair of vertically aligned monitors 18 in a column of the monitor array 16 by attaching a lower portion of the first vertical monitor rod 150 to a lower monitor 18 and a higher portion of the first vertical monitor rod 150 to a higher monitor 18 (block 172). A second vertical monitor rod 150 may be installed between a second pair of vertically aligned monitors 18 in a second, adjacent column of the monitor array 16 by attaching a lower portion of the second vertical monitor rod 150 to a lower monitor 18 and a higher portion of the second vertical monitor rod 150 to a higher monitor 18 (block 174). Thereafter, the horizontal monitor connection bar 152 may be installed between the first vertical monitor rod 150 and the second vertical monitor rod 150 by attaching the horizontal monitor connection bar 152 to the centers of the two vertical monitor rods 150 (block 176). The presence of the horizontal monitor connection bar 152 may horizontally align the two adjacent columns of monitors 18 of the monitor array 16.

It should be understood that other embodiments may provide both horizontal and vertical alignment to four adjacent monitors 18 in a similar fashion. For example, in lieu of a horizontal monitor connection bar 152 and two vertical monitor rods 150, four monitors 18 each having a corner disposed around the same point may be vertically and horizontally aligned using a rigid plate. Such a rigid plate may couple to the corners of the four monitors 18 surrounding the point. The rigid plate may serve to vertically and horizontally align four adjacent monitors 18 regardless of whether the monitors 18 are equipped with a mechanical feature for the vertical monitor rods 150 and/or the horizontal monitor connection bar 152.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The invention claimed is:

1. A video wall support system comprising:
    a first frame of support members having a monitor support structure configured to support an array of monitors such that display screens of the monitors are substantially aligned in a first plane; and
    a second frame of support members configured to support a touch-enabling optical system to detect a user touch location through a second plane formed by the second frame of support members, wherein the second plane is substantially parallel to the first plane and wherein the second frame of support members is disposed a distance from the first frame of support members.

2. The video wall support system of claim 1, wherein the monitor support structure comprises a plurality of ladder structures, each of the plurality of ladder structures comprising at least two vertical support members and at least two horizontal support members.

3. The video wall support system of claim 2, wherein each of the plurality of ladder structures is configured to be attached at a plurality of possible horizontal positions in the monitor support structure.

4. The video wall support system of claim 2, wherein the at least two horizontal support members of each of the plurality of ladder structures are configured to be attached to the two vertical support members at a plurality of possible vertical positions.

5. The video wall support system of claim 2, comprising a monitor support bracket configured to couple to the at least two horizontal support members, wherein at least two horizontal faces of the monitor support bracket are respectively supported by the at least two horizontal support members, wherein the horizontal faces of the monitor support bracket have a greater depth than that of the horizontal support members.

6. The video wall support system of claim 1, wherein the second plane is substantially parallel to the first plane to within a tolerance of less than approximately 2 mm.

7. The video wall support system of claim 1, comprising a plurality of spacing bars configured to rigidly hold the second frame of support members the distance from the first frame of support members.

8. The video wall support system of claim 7, wherein each of the plurality of spacing bars is configured to attach to an outer surface of the first frame of support members and an outer surface of the second frame of support members, such that the distance between the first frame of support members and the second frame of support members depends upon locations on each of the plurality of spacing bars at which each of the plurality of spacing bars attaches to the first frame of support members and the second frame of support members.

9. The video wall support system of claim 7, wherein each of the plurality of spacing bars has an equal length and each of the plurality of spacing bars is configured to attach to oppositely facing surfaces of the first frame of support members and the second frame of support members, such that the distance between the first frame of support members and the second frame of support members is fixed as the length of each of the plurality of spacing bars.

10. The video wall support system of claim 1, comprising the array of monitors, wherein four adjacent corners of monitors of the array of monitors are aligned at least in part via two vertical monitor rods and a horizontal monitor connection bar.

11. The video wall support system of claim 1, further comprising a monitor support bracket, the monitor support bracket comprising:
    two vertical members having attachment holes configured to enable attachment of the monitor support bracket to a monitor of the array of monitors; and
    two horizontal members coupled to the o vertical members each horizontal member comprising:
        a vertical face in a vertical plane coupled to the two vertical members, wherein the vertical face extends horizontally a first distance along a direction from one of the two vertical members to the other of the two vertical members; and
        a horizontal face in a horizontal plane extending from a horizontally central portion of an uppermost portion of the vertical face, wherein the horizontal face extends horizontally a second distance along the direction from one of the two vertical members to the other of the two vertical members, wherein the second distance is less than the first distance, and wherein the horizontal face has a first depth;
    wherein the monitor support bracket is configured to couple to a monitor support structure having two vertical support structure members and two horizontal support structure members, wherein the two horizontal support structure members each have a support structure horizontal face having a second depth, wherein the first depth is greater than the second depth.

12. The video wall support system of claim 11, wherein the horizontal face extends from the horizontally central portion of the uppermost portion of the vertical face toward a horizontally central portion of the horizontal face at a 90 degree angle or less.

13. The video wall support system of claim 11, wherein the horizontal face extends horizontally central portion of an uppermost portion of the vertical face toward a horizontally central portion of the horizontal face at approximately a 60 degree angle.

14. The video wall support system of claim 11, wherein a difference between the first depth and the second depth is approximately half an inch or more.

* * * * *

UNITED STATES PATENT AND TRADEMARK OFFICE
CERTIFICATE OF CORRECTION

| | | |
|---|---|---|
| PATENT NO. | : 9,148,614 B2 | Page 1 of 1 |
| APPLICATION NO. | : 13/817640 | |
| DATED | : September 29, 2015 | |
| INVENTOR(S) | : Thomas H. Szolyga et al. | |

It is certified that error appears in the above-identified patent and that said Letters Patent is hereby corrected as shown below:

On the Title page, in Item (75), Inventors, in column 1, line 2, delete "Milpiltas" and insert -- Milpitas --, therefor.

IN THE CLAIMS

In column 10, line 28, in Claim 11, delete "the o" and insert -- the two --, therefor.

In column 10, line 28, in Claim 11, delete "members" and insert -- members, --, therefor.

Signed and Sealed this
Twenty-second Day of March, 2016

Michelle K. Lee
*Director of the United States Patent and Trademark Office*